US012562349B2

(12) United States Patent
Yaguchi

(10) Patent No.: US 12,562,349 B2
(45) Date of Patent: Feb. 24, 2026

(54) SUBSTRATE PROCESSING APPARATUS

(71) Applicant: Tokyo Electron Limited, Tokyo (JP)

(72) Inventor: Tetsuma Yaguchi, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 189 days.

(21) Appl. No.: 18/354,944

(22) Filed: Jul. 19, 2023

(65) Prior Publication Data

US 2024/0030005 A1 Jan. 25, 2024

(30) Foreign Application Priority Data

Jul. 20, 2022 (JP) ................................. 2022-115843

(51) Int. Cl.
*H01J 37/32* (2006.01)

(52) U.S. Cl.
CPC ..... *H01J 37/32568* (2013.01); *H01J 2237/04* (2013.01)

(58) Field of Classification Search
None
See application file for complete search history.

(56) References Cited

U.S. PATENT DOCUMENTS 5,998,932 A * 12/1999 Lenz ................. H01J 37/32623
118/728
2019/0006155 A1 1/2019 Zhao et al.
2021/0249233 A1* 8/2021 Kajifusa ........... H01L 21/31116

FOREIGN PATENT DOCUMENTS

JP 2001-185542 7/2001
JP 2010-283028 12/2010
JP 2011-108764 6/2011

* cited by examiner

*Primary Examiner* — Kenneth B Wells
(74) *Attorney, Agent, or Firm* — IPUSA, PLLC

(57) ABSTRACT

A substrate processing apparatus includes a plasma processing chamber configured to accommodate a substrate, and a ring assembly provided around the substrate and including a dielectric, and a potential generator disposed on the dielectric and formed of a conductive material. A lower surface of the potential generator is disposed at a position higher than an upper surface of the substrate. The substrate processing apparatus further includes a power supply configured to supply a direct current signal or a radio frequency signal to the potential generator.

11 Claims, 12 Drawing Sheets

SUBSTRATE PROCESSING APPARATUS

CROSS-REFERENCE TO RELATED APPLICATIONS

This application is based upon and claims priority to Japanese Patent Application No. 2022-115843, filed on Jul. 20, 2022, the entire contents of which are incorporated herein by reference.

BACKGROUND

1. Field of the Invention

The present disclosure relates to substrate processing apparatuses.

2. Description of the Related Art

For example, Japanese Laid-Open Patent Publication No. 2001-185542 describes a plasma processing apparatus including a current path correction means for correcting a current path portion near an outer periphery of a substrate in a high-frequency current path formed by a high-frequency bias, toward a surface of a counter electrode opposing the substrate.

SUMMARY

According to one aspect of the present disclosure, a substrate processing apparatus includes a plasma processing chamber configured to accommodate a substrate; a ring assembly provided around the substrate, and including a dielectric, and a potential generator disposed on the dielectric and formed of a conductive material, wherein a lower surface of the potential generator is disposed at a position higher than an upper surface of the substrate; and a power supply configured to supply a direct current signal or a radio frequency signal to the potential generator.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

DETAILED DESCRIPTION

Figure 1:
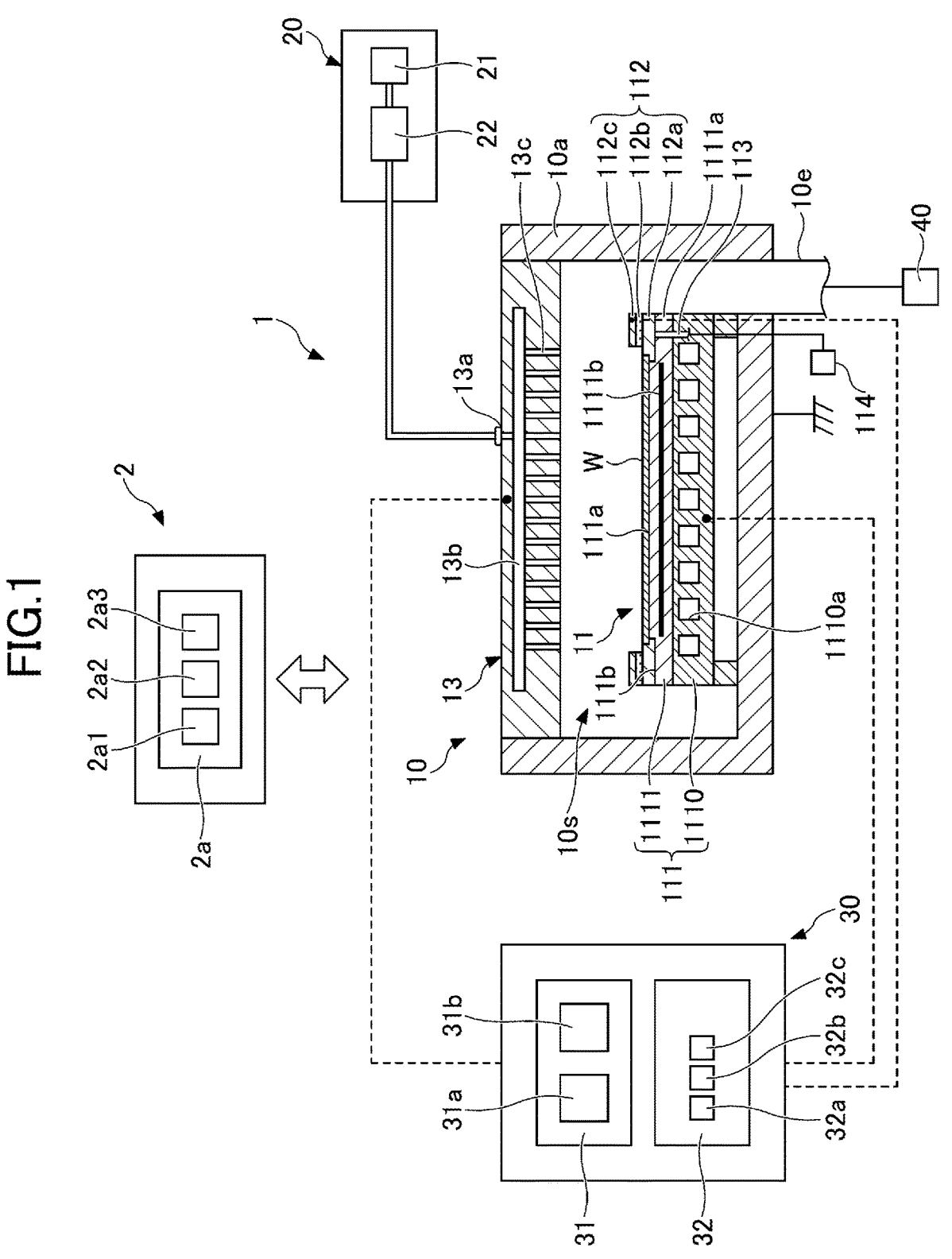
FIG. 1 is a diagram illustrating an example of a configuration of a capacitively coupled plasma processing apparatus according to a first embodiment.

According to one aspect of the present disclosure, there is provided a substrate processing apparatus that reduces a discharge while controlling an incident angle of ions at an outer periphery of a substrate.

Various embodiments will be described in detail, with reference to the drawings. In the drawings, the same or corresponding parts are designated by the same reference numerals, a redundant description of the same or corresponding parts may be omitted.

Hereinafter, an example of a configuration of a plasma processing system will be described. FIG. 1 is a diagram illustrating an example of a configuration of a capacitively coupled plasma processing apparatus according to a first embodiment.

The plasma processing system includes a capacitively coupled plasma processing apparatus 1, and a controller 2. The capacitively coupled plasma processing apparatus 1 includes a plasma processing chamber 10 configured to accommodate a substrate W which will be described later, a gas supply 20, a power supply 30, and an exhaust system 40. The plasma processing apparatus 1 further includes a substrate support 11, and a gas injector. The gas injector is configured to inject or introduce at least one process gas into the plasma processing chamber 10. The gas injector includes a shower head 13. The substrate support 11 is disposed inside the plasma processing chamber 10. The shower head 13 is disposed above the substrate support 11. In one embodiment, the shower head 13 forms at least a portion of a ceiling of plasma processing chamber 10. The plasma processing chamber 10 includes a plasma processing space 10s defined by the shower head 13, a sidewall 10a of the plasma processing chamber 10, and the substrate support 11. The plasma processing chamber 10 includes at least one gas inlet configured to supply at least one process gas to the plasma processing space 10s, and at least one gas outlet configured to exhaust the gas from the plasma processing space 10s. The plasma processing chamber 10 is grounded. The shower head 13 and the substrate support 11 are electrically insulated from a housing of the plasma processing chamber 10.

The substrate support 11 includes a main body 111, and a ring assembly 112. The main body 111 has a central region 111a configured to support the substrate W, and an annular region 111b configured to support the ring assembly 112.

Examples of the substrate W include a wafer or the like, for example. The annular region 111b of the main body 111 surrounds the central region 111a of the main body 111 in a plan view. The substrate W is disposed on the central region 111a of the main body 111, and the ring assembly 112 is disposed on the annular region 111b of the main body 111 so as to surround the substrate W on the central region 111a of the main body 111. Accordingly, the central region 111a may also be referred to as a substrate support surface configured to support the substrate W, and the annular region 111b may also be referred to as a ring support surface configured to support the ring assembly 112.

In one embodiment, the main body 111 includes a base 1110, and an electrostatic chuck 1111. The base 1110 includes a conductive member. The conductive member of the base 1110 can function as a lower electrode. The electrostatic chuck 1111 is disposed on the base 1110. The electrostatic chuck 1111 includes a ceramic member 1111a, and an electrostatic electrode 1111b disposed inside the ceramic member 1111a. The ceramic member 1111a has a central region 111a. In one embodiment, the ceramic member 1111a also has an annular region 111b. Other members surrounding the electrostatic chuck 1111, such as an annular electrostatic chuck and an annular insulating member, may have the annular region 111b. In this case, the ring assembly 112 may be disposed on the annular electrostatic chuck or the annular insulating member, or may be disposed on both the electrostatic chuck 1111 and the annular insulating member. In addition, at least one radio frequency/direct current (RF/DC) electrode, coupled to a RP power supply 31 and/or a DC power supply 32 which will be described later, may be disposed inside the ceramic member 1111a. In this case, at least one RF/DC electrode can function as the lower electrode. In a case where a bias RF signal and/or a DC signal, which will be described later, is supplied to at least one RF/DC electrode, the RF/DC electrode may also be referred to as a bias electrode. The conductive member of the base 1110 and at least one RF/DC electrode may function as a plurality of lower electrodes. The electrostatic electrode 1111b may function as the lower electrode. Accordingly, the substrate support 11 includes at least one lower electrode.

The ring assembly 112 includes one or a plurality of annular members. In one embodiment, the one or plurality of annular members includes one or a plurality of edge rings, and at least one cover ring. The edge ring is formed of a conductive material or an insulating material, and the cover ring is formed of an insulating material.

The ring assembly 112 includes a first ring 112a, a second ring 112b, and a third ring 112c. The ring assembly 112 will be described later in more detail, with reference to FIG. 2.

In addition, a gas supply path 113 configured to supply a backside gas for heat transfer, is provided in the annular region 111b of the main body 111, between a back surface of the ring assembly 112 (first ring 112a) and the annular region 111b. The gas supply path 113 is supplied with the backside gas from a gas supply source 114. For example, He gas may be used for the backside gas.

The substrate support 11 may also include a temperature control module configured to control at least one of the electrostatic chuck 1111, the ring assembly 112, and the substrate W to a target temperature. The temperature control module may include a heater, a heat transfer medium, a flow passage 1110a, or a combination thereof. A heat transfer fluid, such as brine or gas, flows through the flow passage 1110a. In one embodiment, the flow passage 1110a is formed inside the base 1110, and one or a plurality of heaters is disposed inside the ceramic member 1111a of the electrostatic chuck 1111. Further, the substrate support 11 may include a heat transfer gas supply configured to supply the heat transfer gas to a gap between a back surface of the substrate W and the central region 111a.

The shower head 13 is configured to inject or introduce at least one process gas from the gas supply 20 into the plasma processing space 10s. The shower head 13 includes at least one gas supply port 13a, at least one gas diffusion chamber 13b, and a plurality of gas injection ports 13c. The process gas supplied to the gas supply port 13a passes through the gas diffusion chamber 13b, and is injected or introduced into the plasma processing space 10s from the plurality of gas injection ports 13c. The shower head 13 includes at least one upper electrode. The gas injector may include one or a plurality of side gas injectors (SGIs) attached to one or a plurality of openings formed in the sidewall 10a, in addition to the shower head 13.

The gas supply 20 may include at least one gas source 21, and at least one flow rate controller 22. In one embodiment, the gas supply 20 is configured to supply at least one process gas from respective gas sources 21 to the shower head 13 via respective flow rate controllers 22. Each flow rate controller 22 may include a mass flow controller or a pressure control type flow rate controller, for example. Further, the gas supply 20 may include one or a plurality of flow modulation devices to modulate or pulse the flow of the at least one process gas.

The power supply 30 includes the RF power supply 31 that is coupled to the plasma processing chamber 10 via at least one impedance matching circuit. The RF power supply 31 is configured to supply at least one RF signal (RF power) to at least one lower electrode and/or at least one upper electrode. Hence, plasma is formed from the at least one process gas supplied to the plasma processing space 10s. Accordingly, the RF power supply 31 may function as at least a portion of a plasma generator configured to generate the plasma from one or a plurality of process gases in the plasma processing chamber 10. Further, by supplying the bias RF signal to at least one lower electrode, a bias potential is generated in the substrate W, and ion components in the formed plasma can be attracted to the substrate W.

In one embodiment, the RF power supply 31 includes a first RF generator 31a, and a second RF generator 31b. The first RF generator 31a is coupled to at least one lower electrode and/or at least one upper electrode, via at least one impedance matching circuit, and is configured to generate a source RF signal (source RF power) for generating plasma. In one embodiment, the source RF signal has a frequency in a range of 10 MHz to 150 MHz. In one embodiment, the first RF generator 31a may be configured to generate a plurality of source RF signals having different frequencies. The one or plurality of source RF signals that is generated, is supplied to at least one lower electrode and/or at least one upper electrode.

The second RF generator 31b is coupled to at least one lower electrode, via at least one impedance matching circuit, and is configured to generate a bias RF signal (bias RF power). A frequency of the bias RF signal may be the same as or different from the frequency of the source RF signal. In one embodiment, the bias RF signal has a frequency that is lower than the frequency of the source RF signal. In one embodiment, the bias RF signal has a frequency in a range of 100 kHz to 60 MHz. In one embodiment, the second RF generator 31b may be configured to generate a plurality of bias RF signals having different frequencies. The one or plurality of bias RF signals are supplied to at least one lower electrode. In addition, in various embodiments, at least one of the source RF signal and the bias RF signal may be pulsed.

Moreover, the power supply 30 may include a DC power supply 32 that is coupled to the plasma processing chamber 10. The DC power supply 32 includes a first DC generator 32a, a second DC generator 32b, and a third DC generator 32c. In one embodiment, the first DC generator 32a is connected to at least one lower electrode, and is configured to generate a first DC signal. The generated first DC signal is applied to at least one lower electrode. In one embodiment, the second DC generator 32b is connected to at least one upper electrode, and is configured to generate a second DC signal. The generated second DC signal is applied to at least one upper electrode. In one embodiment, the third DC generator 32c is connected to the third ring 112c of the ring assembly 112, and is configured to generate a third DC signal. The generated third DC signal is applied to the third ring 112c of the ring assembly 112.

In various embodiments, at least one of the first and second DC signals may be pulsed. In this case, a voltage pulse sequence is applied to at least one lower electrode and/or at least one upper electrode. The voltage pulse may have a pulse waveform that is rectangular, trapezoidal, triangular, or a combination thereof. In one embodiment, a waveform generator, configured to generate a voltage pulse sequence from the DC signal, is connected between the first DC generator 32a and at least one lower electrode. Accordingly, the first DC generator 32a and the waveform generator form a voltage pulse generator. In a case where the second DC generator 32b and the waveform generator form a voltage pulse generator, this voltage pulse generator is connected to at least one upper electrode. The voltage pulse may have a positive polarity or a negative polarity. In addition, the voltage pulse sequence may include one or a plurality of positive voltage pulses and one or a plurality of negative voltage pulses within one cycle. The first and second DC generators 32a and 32b may be provided in addition to the RF power supply 31, or the first DC generator 32a may be provided in place of the second RF generator 31b.

The exhaust system 40 may be connected to a gas outlet 10e provided at a bottom of the plasma processing chamber 10, for example. The exhaust system 40 may include a pressure control valve and a vacuum pump. A pressure inside the plasma processing space 10s is controlled by the pressure control valve. The vacuum pump may include a turbo-molecular pump, a dry pump, or a combination thereof.

The controller 2 processes computer-executable instructions that cause the plasma processing apparatus 1 to perform various processes described in the present disclosure. The controller 2 may be configured to control each element of the plasma processing apparatus 1 to perform various processes described herein. In one embodiment, a part or all of the controller 2 may be included in the plasma processing apparatus 1. The controller 2 may include a processor 2a1, a storage 2a2, and a communication interface 2a3. The controller 2 can be formed by a computer 2a, for example. The processor 2a1 may be configured to perform various control operations by reading a program from the storage 2a2 and executing the read program. This program may be stored in the storage 2a2 in advance, or may be acquired via a medium, as required. The acquired program is stored in the storage 2a2, and is read from the storage 2a2 and executed by the processor 2a1. The medium may be various computer-readable storage media readable by the computer 2a, or may be a communication line connected to the communication interface 2a3. The processor 2a1 may be a central processing unit (CPU). The storage 2a2 may include a random access memory (RAM), a read only memory (ROM), a hard disk drive (HDD), a solid state drive (SSD), or a combination thereof. The communication interface 2a3 may communicate with the plasma processing apparatus 1 via a communication line, such as a local area network (LAN) or the like.

Figure 2:
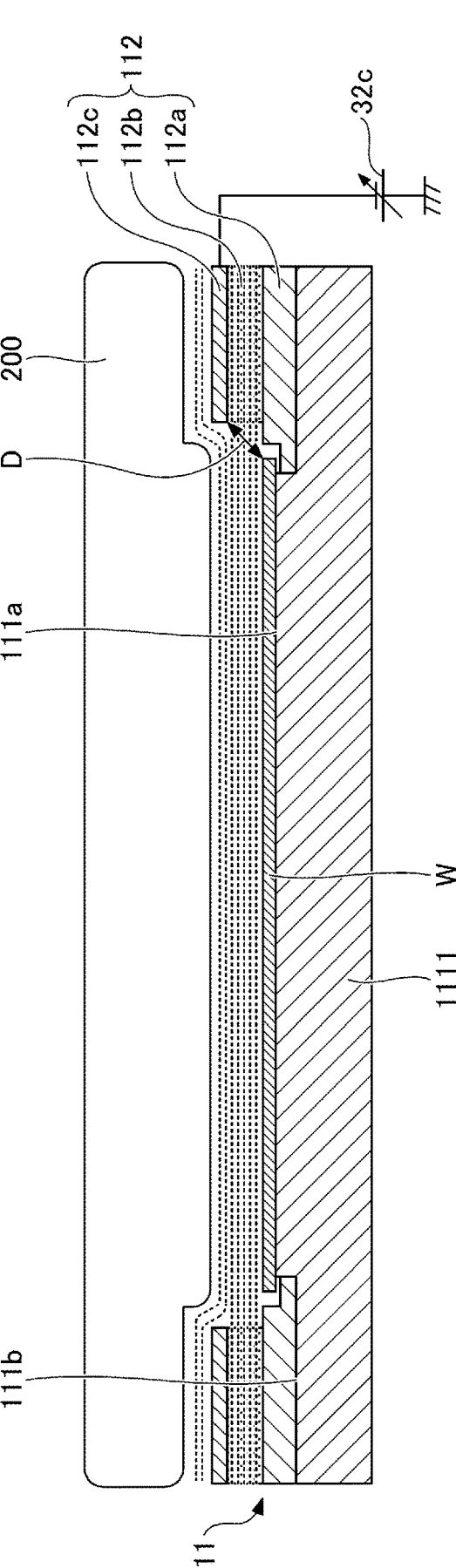
FIG. 2 is a cross sectional view illustrating an example of a substrate support in the plasma processing apparatus according to the first embodiment.

Next, the substrate support 11 included in the plasma processing apparatus 1 according to the first embodiment will further be described, with reference to FIG. 2 through FIG. 6. FIG. 2 is a cross sectional view illustrating an example of the substrate support 11 in the plasma processing apparatus 1 according to the first embodiment. In FIG. 2, an example of equipotential lines when plasma 200 is generated is illustrated by broken lines.

The ring assembly 112 includes the first ring 112a, the second ring 112b, and the third ring 112c.

The first ring 112a is an annular member formed of a conductive material, and is disposed so as to surround the substrate W. The conductive material used for the first ring 112a may be Si, SiC, or the like. The first ring 112a is disposed in the annular region 111b. A potential is generated in the substrate W and the first ring 112a that are disposed on the electrostatic chuck 1111, when the first DC generator 32a (refer to FIG. 1) applies the first DC signal to the lower electrode of the base 1110 (refer to FIG. 1). The first ring 112a is also referred to as an edge ring.

The second ring 112b is an annular member formed of a dielectric material, and is provided on the first ring 112a. The dielectric material used for the second ring 112b may be SiO₂ or the like.

The third ring 112c is an annular member formed of a conductive material, and is provided on the second ring 112b. The conductive material used for the third ring 112c may be Si, SiC, or the like. A potential is generated in the third ring 112c, when the third DC generator 32c applies the third DC signal to the third ring 112c. The third DC generator 32c is a variable power supply, and is configured to be able to vary an intensity of the DC signal (voltage) applied to the third ring 112c. In the ring assembly 112 according to the first embodiment, the third ring 112c is an example of a potential generator.

In addition, a lower surface of the third ring 112c is disposed at a position higher than an upper surface of the substrate W disposed on the electrostatic chuck 1111.

The second ring 112b is formed to have an inside diameter larger than an inside diameter of the first ring 112a. The third ring 112c is formed to have an inside diameter larger than the inside diameter of the first ring 112a, and equal to the inside diameter of the second ring 112b. Thus, an upper surface of the ring assembly 112 has a stepped portion.

Figure 3:
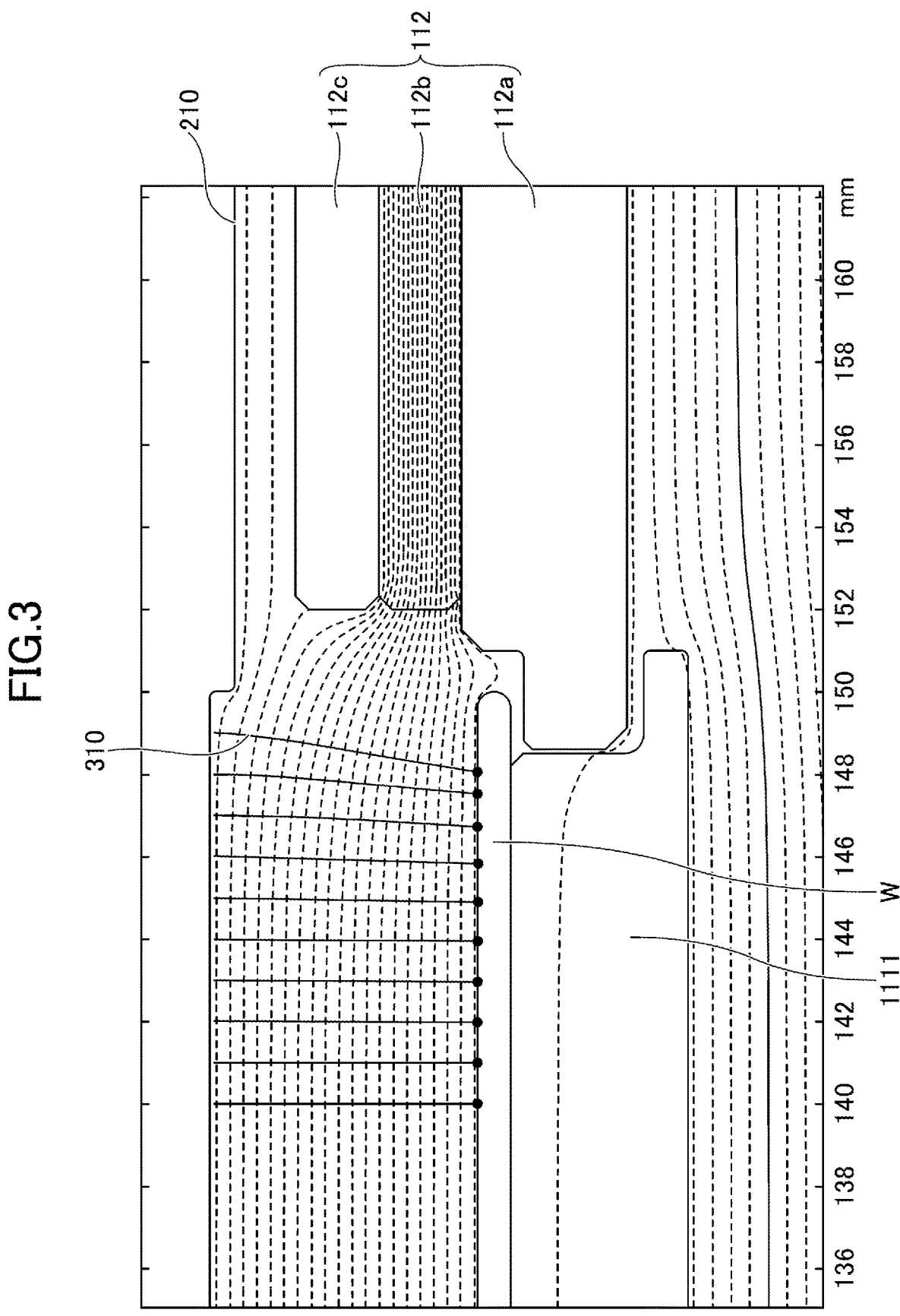
FIG. 3 is a diagram illustrating an example of simulation results of trajectories of ions near an outer periphery of the substrate.
Figure 4:
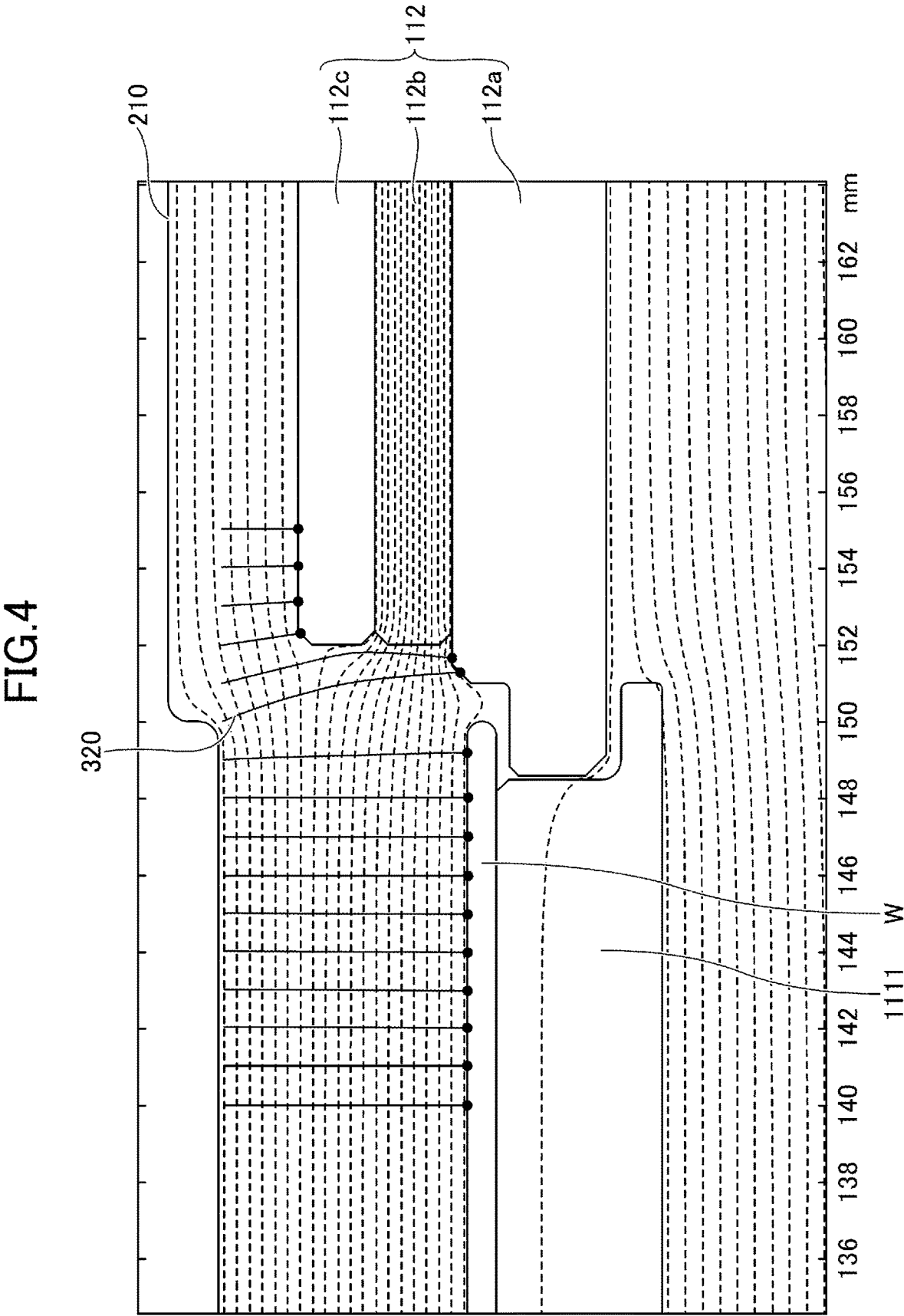
FIG. 4 is a diagram illustrating the example of the simulation results of the trajectories of ions near the outer periphery of the substrate.
Figure 5:
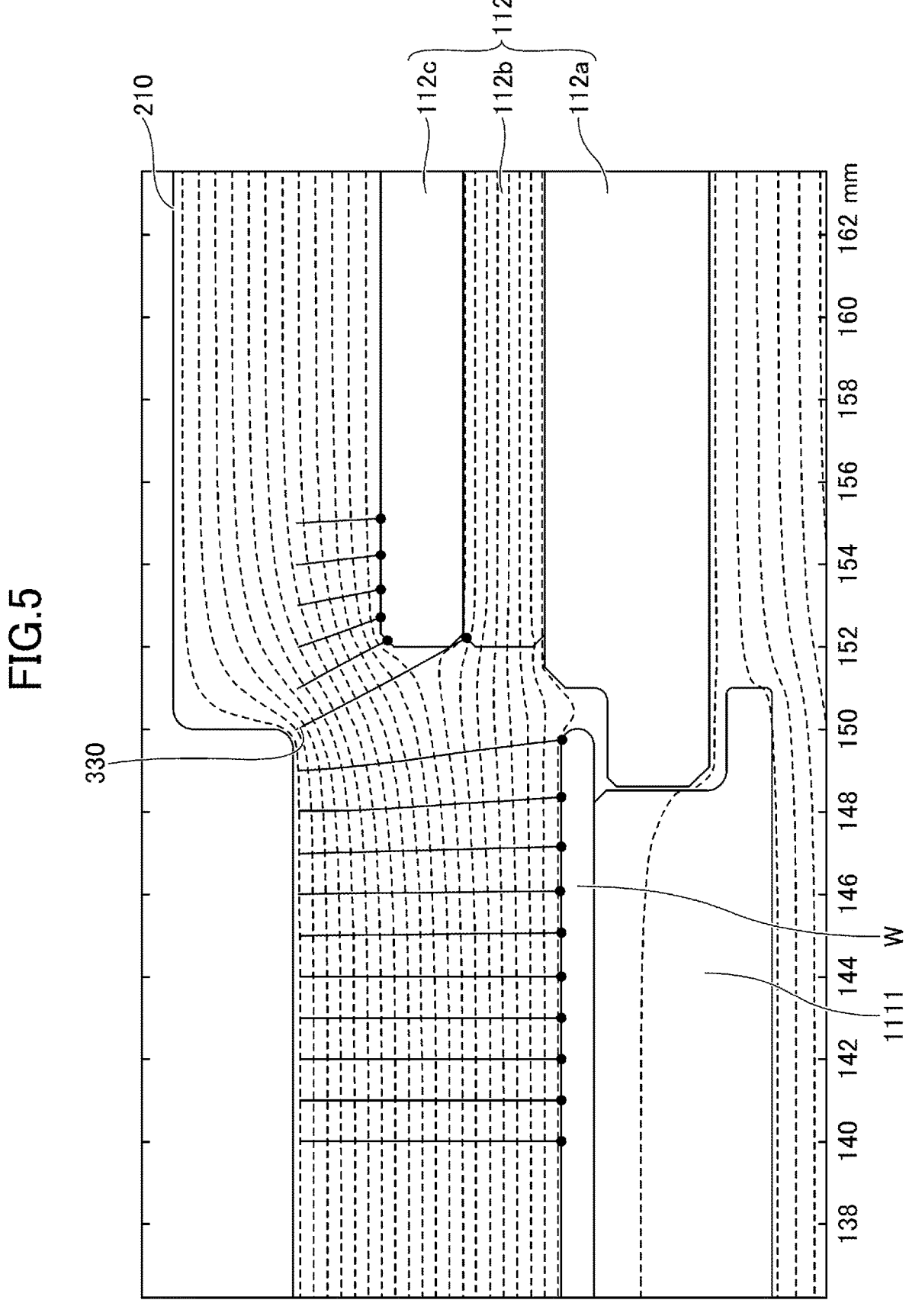
FIG. 5 is a diagram illustrating the example of the simulation results of the trajectories of ions near the outer periphery of the substrate.

FIG. 3 through FIG. 5 are examples of simulation results of trajectories of ions near an outer periphery of the substrate W. The abscissa represents a position R [mm] in a radial direction from a center of the substrate W, and the ordinate represents a height direction. The position at the radius of 150 mm is an edge of the substrate W. In FIG. 3 through FIG. 5, a potential of the substrate W is −800 V, and a potential of the first ring 112a is −800 V. In addition, the DC signal applied from the third DC generator 32c to the third ring 112c was varied. Further, an example of equipotential lines, when an Ar gas is supplied from the gas supply 20 through the shower head 13 and plasma of the Ar gas is generated, is illustrated by broken lines.

FIG. 3 illustrates a trajectory 310 of Ar ions when the potential of the third ring 112c is −100 V. In this case, at an inner periphery (on a left side in FIG. 3) of the substrate W, the equipotential lines are arranged approximately uniformly in the height direction. On the other hand, at the outer periphery (on a right side of 150 mm in FIG. 3) of the substrate W, a potential difference between the first ring 112a and the third ring 112c is larger than those for the cases illustrated in FIG. 4 and FIG. 5 which will be described later, and the equipotential lines are shaped so that more equipotential lines pass between the first ring 112a and the third ring 112c compared to the cases illustrated in FIG. 4 and FIG. 5 which will be described later. As a result, an incident angle of the Ar ions near the outer periphery of the substrate W can be made inward, as illustrated by the trajectory 310 of the Ar ions in FIG. 3. In addition, a number of equipotential lines passing over the third ring 112c is smaller than those for the cases illustrated in FIG. 4 and FIG. 5 which will be described later. For this reason, a thickness of a sheath on the third ring 112c is thinner than those for the cases illustrated in FIG. 4 and FIG. 5 which will be described later.

FIG. 4 illustrates a trajectory 320 of Ar ions when the potential of the third ring 112c is −300 V. In this case, at the inner periphery (on the left side in FIG. 4) of the substrate W, the equipotential lines are arranged approximately uniformly in the height direction. On the other hand, at the outer periphery (on the right side of the 150 mm in FIG. 4) of the substrate W, the potential difference between the first ring 112a and the third ring 112c is smaller than that for the case illustrated in FIG. 3 described above, and the equipotential lines are shaped so that the number of equipotential lines passing between the first ring 112a and the third ring 112c is smaller than that for the case illustrated in FIG. 3 described above. As a result, the incident angle of the Ar ions near the outer periphery of the substrate W can be made approximately vertical, as illustrated by the trajectory 320 of the Ar ions in FIG. 4. Further, the number of equipotential lines passing over the third ring 112c is larger than that for the case illustrated in FIG. 3 described above. Thus, the thickness of the sheath on the third ring 112c is thicker than that for the case illustrated in FIG. 3 described above.

FIG. 5 illustrates the trajectory 310 of Ar ions when the potential of the third ring 112c is −500 V. In this case, at the inner periphery (on the left side in FIG. 5) of the substrate W, the equipotential lines are arranged approximately uniformly in the height direction. On the other hand, at the outer periphery (on the right side of 150 mm in FIG. 5) of the substrate W, the potential difference between the first ring 112a and the third ring 112c is smaller than those for the cases illustrated in FIG. 3 and FIG. 4 described above, and the equipotential lines are shaped so that the number of equipotential lines passing between the first ring 112a and the third ring 112c is smaller than those for the cases illustrated in FIG. 3 and FIG. 4 described above. As a result, the incident angle of the Ar ions near the outer periphery of the substrate W can be made outward, as illustrated by a trajectory 330 of the Ar ions in FIG. 5. Further, the number of equipotential lines passing over the third ring 112c is larger than that for the case illustrated in FIG. 4 described above. Thus, the thickness of the sheath on the third ring 112c is thicker than that for the case illustrated in FIG. 4 described above.

Figure 6:
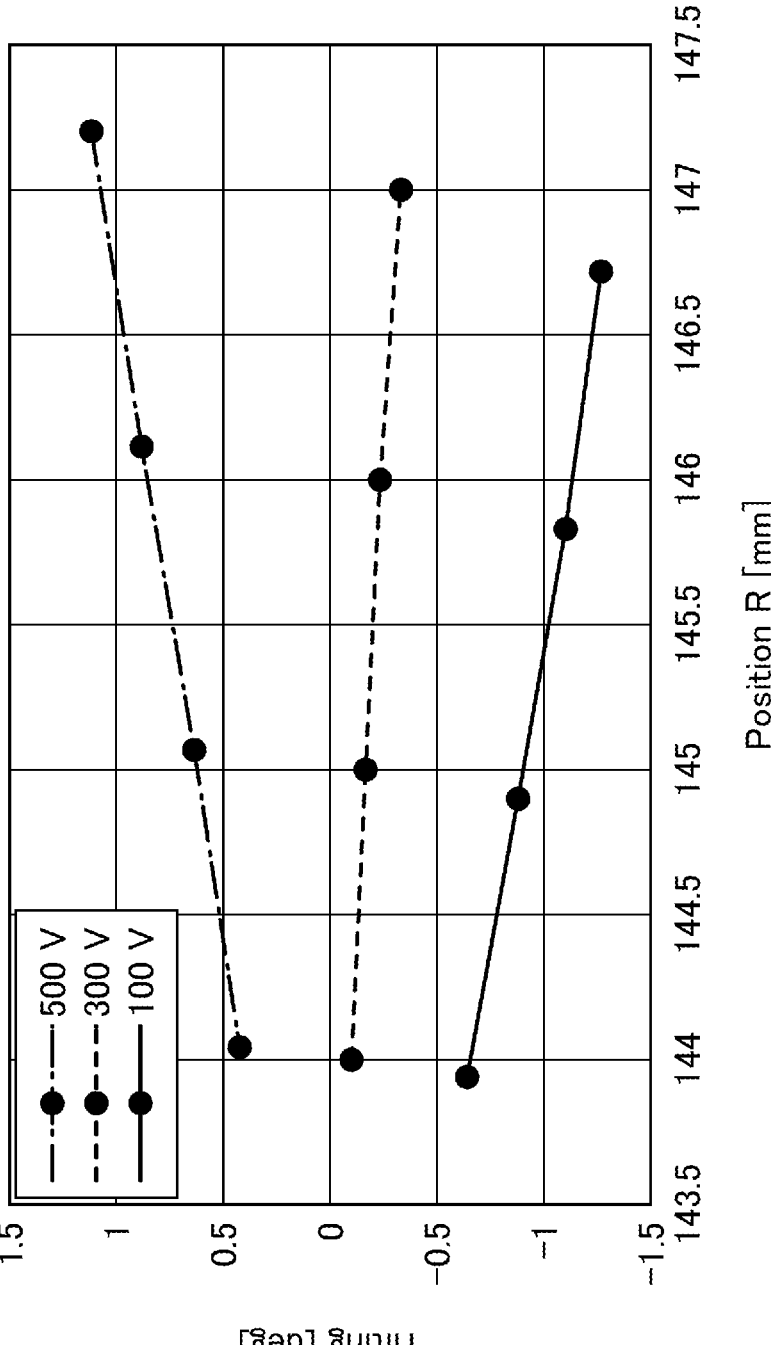
FIG. 6 is an example of a graph illustrating the simulation results.

FIG. 6 is an example of a graph illustrating the simulation results illustrated in FIG. 3 through FIG. 5. In FIG. 6, the abscissa represents the position R [mm] in the radial direction from the center of the substrate W having the radius of 150 mm, and the ordinate represents the incident angle (hereinafter also referred to as "tilting") [deg] of the Ar ions with respect to the substrate W. On the ordinate representing the incident angle of the Ar ions, a negative value indicates the tilting toward the inner periphery of the substrate W, and a positive value indicates the tilting toward the outer periphery of the substrate W.

The incident angle of the Ar ions when the potential of the third ring 112c is −100 V (refer to FIG. 3) is indicated by a solid line, the incident angle of the Ar ions when the potential of the third ring 112c is −300 V (refer to FIG. 4) is indicated by a broken line, and the incident angle of the Ar ions when the potential of the third ring 112c is −500 V (refer to FIG. 5) is indicated by a one-dot chain line.

As illustrated in FIG. 3 through FIG. 5 and FIG. 6, by varying the potential of the third ring 112c, it is possible to vary the thickness of the sheath on the third ring 112c, and vary a state of the equipotential lines passing between the first ring 112a and the third ring 112c. Accordingly, it possible to control the incident angle (tilting) of the Ar ions at the outer periphery of the substrate W.

For example, by making the thickness of the third ring 112c thicker in the height direction, the incident angle of the Ar ions at the outer periphery of the substrate W shifts outward. In this case, the incident angle of the Ar ions can be shifted inward by applying the DC signal to the third ring 112c so that the potential difference between the first ring 112a and the third ring 112c becomes large (refer to FIG. 3). Hence, the incident angle of the Ar ions incident to the outer periphery of the substrate W can be made approximately vertical.

In addition, the incident angle of the Ar ions at the outer periphery of the substrate W shifts inward when the third ring 112c is consumed by the plasma processing and the third ring 112c becomes thinner in the height direction. In this case, the incident angle of the Ar ions can be shifted outward by applying the DC signal to the third ring 112c so that the potential difference between the first ring 112a and the third ring 112c becomes small (refer to FIG. 5). Hence, the incident angle of the Ar ions incident to the outer periphery of the substrate N can be made approximately vertical.

Next, a ring assembly according to a reference example, included in a plasma processing apparatus according to a reference example, will be described. The ring assembly according to the reference example has an annular member (corresponding to the first ring 112a illustrated in FIG. 2) formed of a conductive material and disposed so as to surround the substrate W. Further, in the ring assembly according to the reference example, a thickness of a sheath on the annular member is increased by directly applying a voltage to the annular member, so as to control the incident angle of the ions at the outer periphery of the substrate W.

However, in the configuration of the ring assembly according to the reference example, the incident angle of the Ar ions incident to the outer periphery of the substrate N can be shifted outward by applying a voltage to the annular member, but cannot be shifted inward. Hence, the incident angle of the Ar ions, shifted outward by making the thickness of the annular member thick in the height direction, cannot be corrected by applying the voltage.

In contrast, in the configuration of the ring assembly 112 according to the first embodiment, the incident angle of the Ar ions incident to the outer periphery of the substrate W can be controlled inward and outward. For this reason, even if the thickness of the third ring 112c that is consumed by the plasma processing is made thick, the incident angle of the Ar ions can be controlled to be approximately vertical, and a maintenance interval of the ring assembly 112 can be extended. That is, it is possible to improve a productivity of the plasma processing apparatus 1.

Moreover, in the configuration of the ring assembly according to the reference example, when the potential difference between the substrate W and the annular member becomes large, a discharge may occur between the substrate W and the annular member. In addition, under a processing condition in which a large amount of reaction byproduct is generated during the processing of the substrate W, there is a high possibility that the discharge will occur between the substrate W and the annular member. In addition, because a potential difference occurs inside the gas supply path 113 due to a potential difference between the annular member and the base 1110, a discharge may occur inside the gas supply path 113.

In contrast, in the configuration of the ring assembly 112 of the first embodiment, a voltage is applied to the third ring 112c. In addition, the third ring 112c is formed to have the inside diameter larger than the inside diameter of the first ring 112a that is disposed to surround the substrate W. That is, in the radial direction of the substrate W of this configuration, a distance from the substrate W to the third ring 112c is longer than a distance from the substrate W to the first ring 112a. Moreover, the third ring 112c is disposed at a position separated from the substrate W in the height direction. Hence, it is possible to reduce the discharge from occurring between the substrate W and the third ring 112c. Further, it is possible to reduce the discharge from occurring inside the gas supply path 113.

In other words, in the ring assembly 112 according to the first embodiment, it is possible to increase the potential difference with respect to the substrate W, while preventing the discharge from occurring, when compared to the ring assembly according to the reference example. Thus, a control range of the incident angle (tilting) of the ions can be enlarged in the ring assembly 112 according to the first embodiment.

Figure 7:
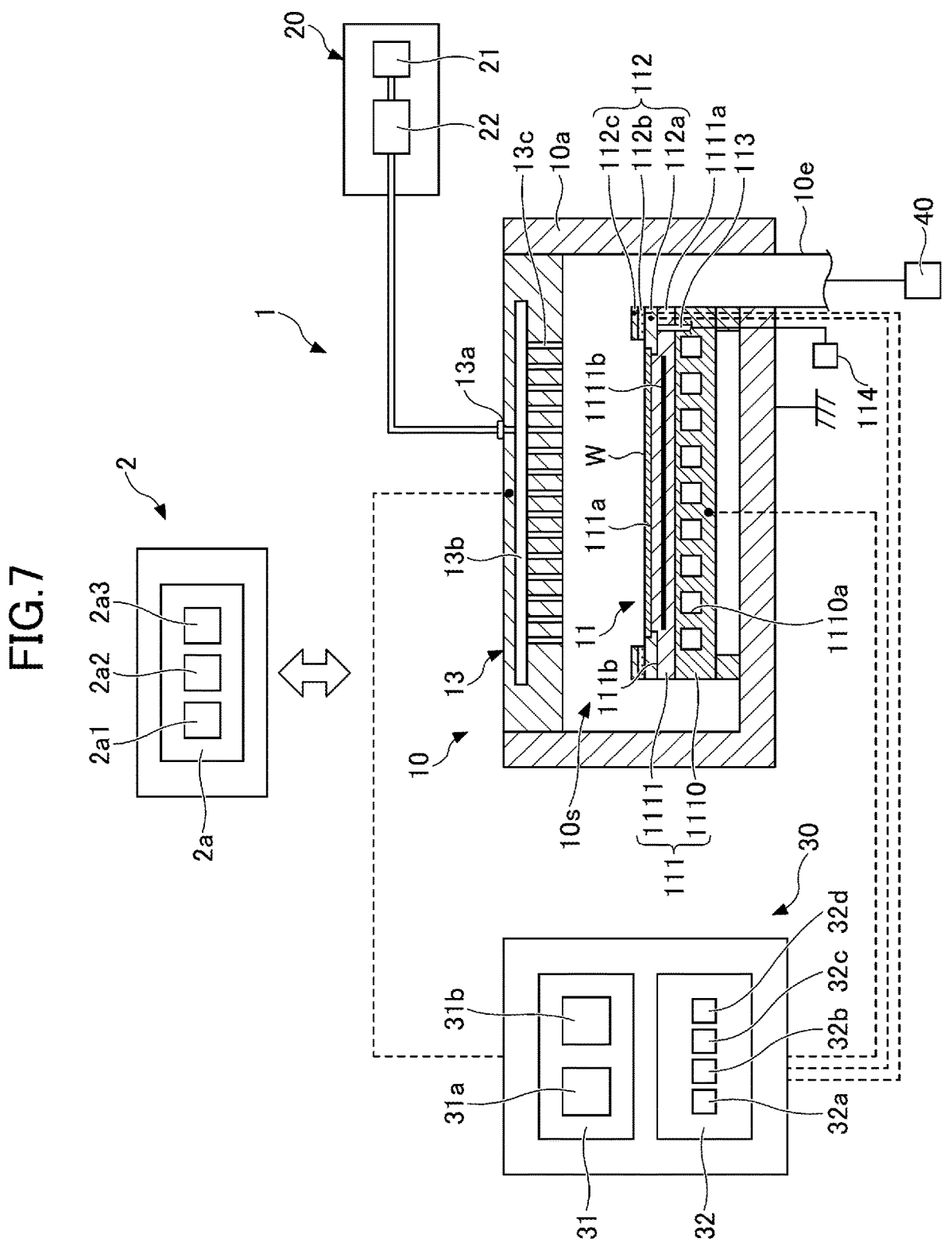
FIG. 7 is a diagram for explaining an example of a configuration of the capacitively coupled plasma processing apparatus according to a second embodiment.
Figure 8:
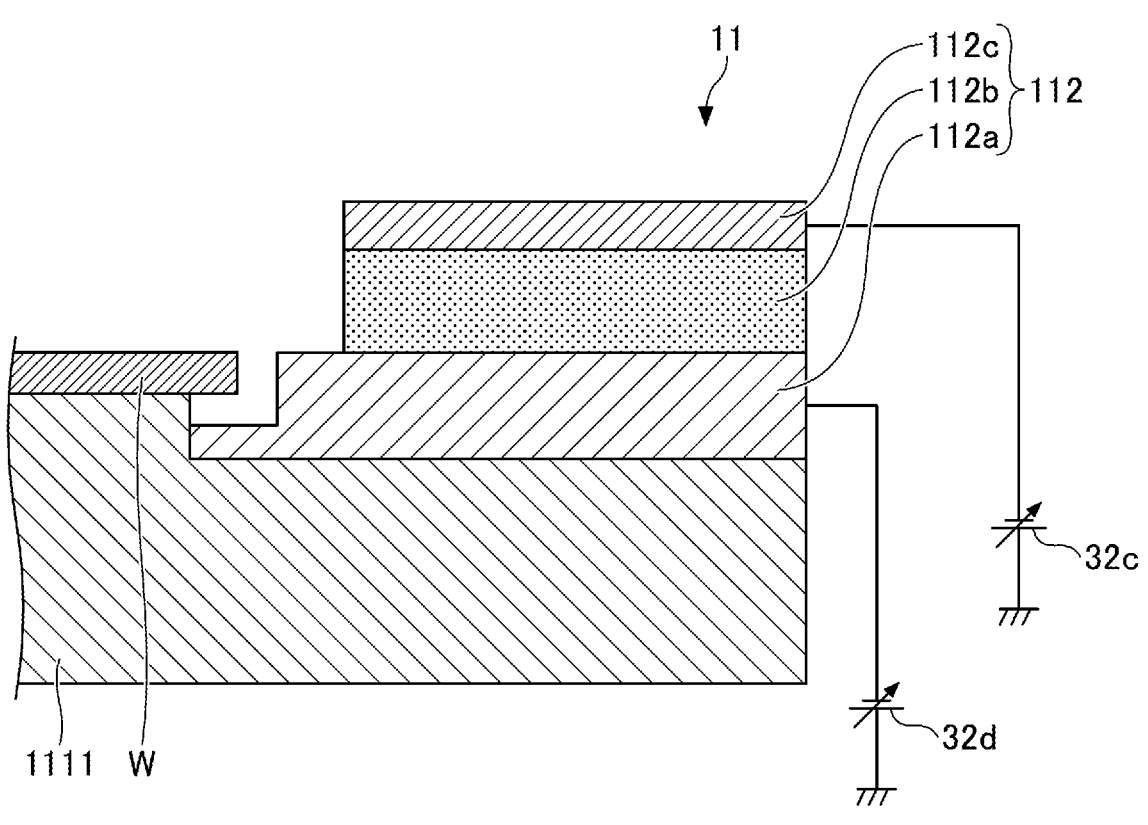
FIG. 8 is a cross sectional view illustrating an example of the substrate support in the plasma processing apparatus according to the second embodiment.

FIG. 7 is a diagram for explaining an example of a configuration of the capacitively coupled plasma processing apparatus 1 according to a second embodiment. FIG. 8 is a cross sectional view illustrating an example of the substrate support 11 in the plasma processing apparatus 1 according to the second embodiment.

That is, the power supply 30 may include the DC power supply 32 coupled to the plasma processing chamber 10. The DC power supply 32 includes the first DC generator 32a, the second DC generator 32b, the third DC generator 32c, and a fourth DC generator 32d. In one embodiment, the fourth DC generator 32d is coupled to the first ring 112a of the ring assembly 112, and is configured to generate a fourth DC signal. The generated fourth DC signal is applied to the first ring 112a of the ring assembly 112. In the ring assembly 112 according to the second embodiment, the third ring 112c is an example of the potential generator.

Figure 9:
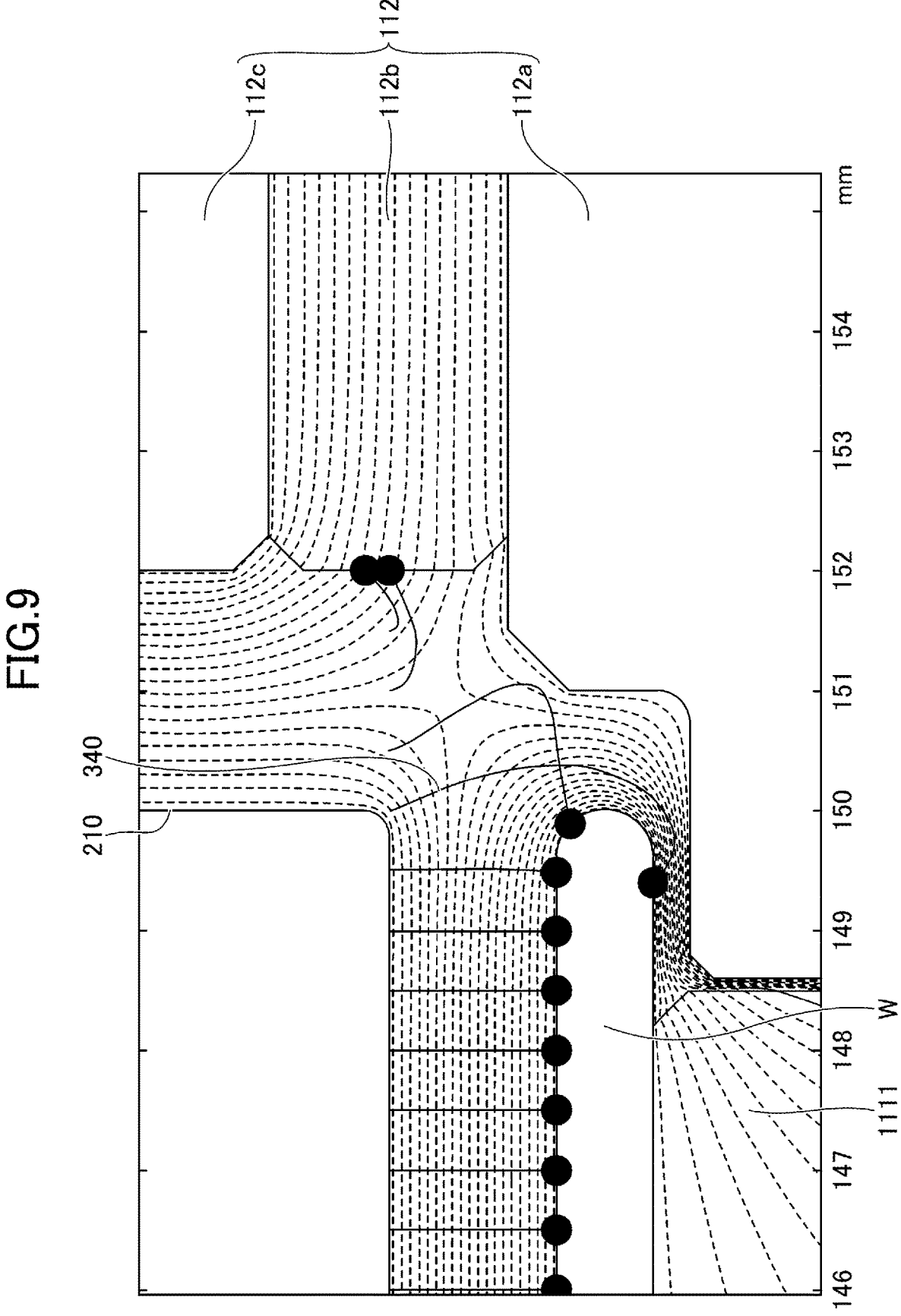
FIG. 9 is diagram illustrating an example of simulation results of the trajectories of ions near the outer periphery of the substrate.

FIG. 9 is diagram illustrating an example of simulation results of the trajectories of ions near the outer periphery of the substrate W. The abscissa represents the position R [mm] in the radial direction from the center of the substrate W, and the ordinate represents the height direction. In addition, in FIG. 9, the potential of the substrate W is −100 V, the potential of the first ring 112a is −20 V, and the potential of the third ring 112c is −100 V. Further, an example of equipotential lines, when the Ar gas is supplied from the gas supply 20 through the shower head 13 and the plasma of the Ar gas is generated, is illustrated by broken lines.

Because the third DC generator 32c controls the potential of the third ring 112c, and the fourth DC generator 32d controls the potential of the first ring 112a, it is possible to further improve a controllability of the state of the equipotential lines passing between the first ring 112a and the third ring 112c. Thus, by varying the potentials of the first ring 112a and the third ring 112c, the controllability of the incident angle (tilting) of the Ar ions at the outer periphery of the substrate W can further be improved, as illustrated by a trajectory 340 of the Ar ions in FIG. 9.

The potential difference between the first ring 112a and the substrate W can be controlled, by controlling the potential of the first ring 112a by the fourth DC generator 32d. Hence, as illustrated in FIG. 9, the Ar ions can be made to become incident to the back surface of the substrate W at the outer periphery thereof, by making the Ar ions go around to the back surface of the substrate W. The reaction byproduct adhered to the back surface of the substrate W at the outer periphery thereof may cause electric field concentration, and cause a discharge between the substrate W and the first ring 112a. However, the reaction byproduct adhered to the back surface of the substrate W can be removed by making the Ar ions become incident to the back surface of the substrate W. Thus, it is possible to reduce the discharge from occurring.

In addition, it is possible to make the Ar ions become incident to a side surface of the electrostatic chuck 1111, by making the Ar ions go around to the back surface of the substrate W. Accordingly, it is possible to remove the reaction byproduct adhered to the side surface of the electrostatic chuck 1111. Thus, it is possible to reduce the discharge from occurring.

The DC signal from the DC power supply 32 is applied to the third ring 112c and the first ring 112a in the configuration described above, but the present disclosure is not limited to this configuration. For example, a RF signal from a RF power supply (not illustrated) may be applied to the third ring 112c and the first ring 112a.

Figure 10:
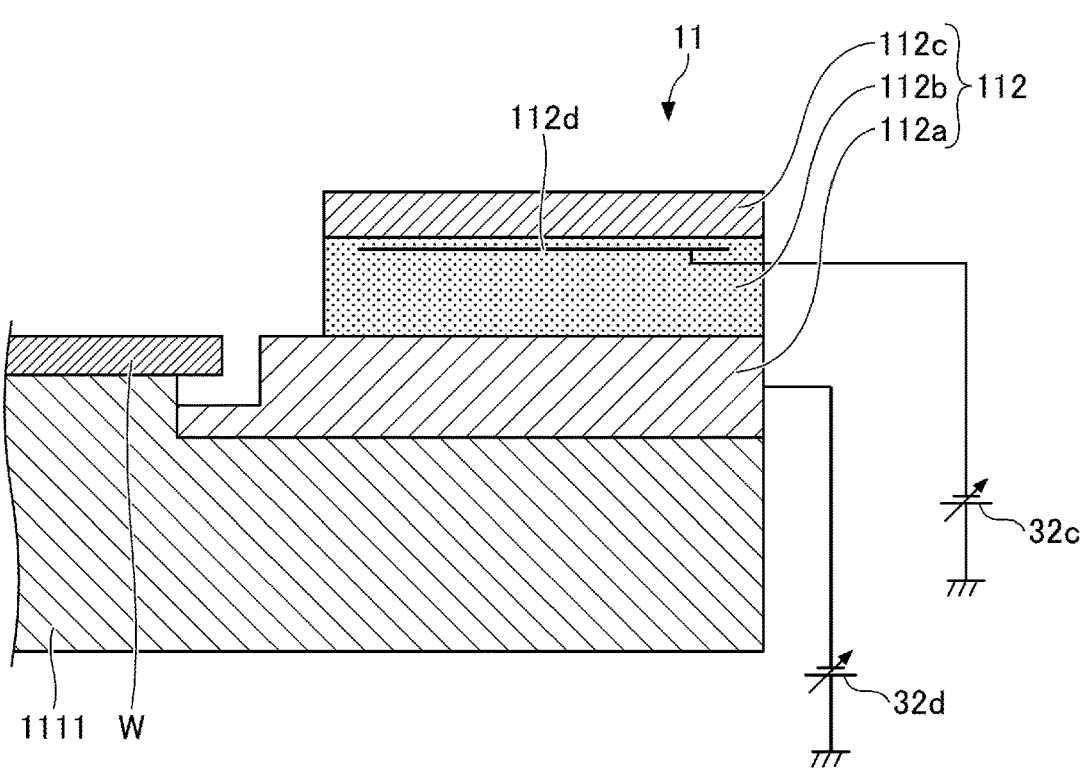
FIG. 10 is a cross sectional view illustrating an example of the substrate support in the plasma processing apparatus according to a third embodiment.

FIG. 10 is a cross sectional view illustrating an example of the substrate support 11 in the plasma processing apparatus 1 according to a third embodiment. In the ring assembly 112 according to the third embodiment, the electrode 112d is formed inside the second ring 112b. In the ring assembly 112 according to the third embodiment, the electrode 112d is an example of the potential generator. In addition, the third DC generator 32c applies a DC signal to the electrode 112d. By forming a capacitor between the electrode 112d and the third ring 112c, a potential is generated in the third ring 112c. Thus, the third DC generator 32c can control the potential of the third ring 112c to control the state of the equipotential lines, thereby controlling the angle of incidence (tilting) of the Ar ions at the outer periphery of the substrate W.

Figure 11:
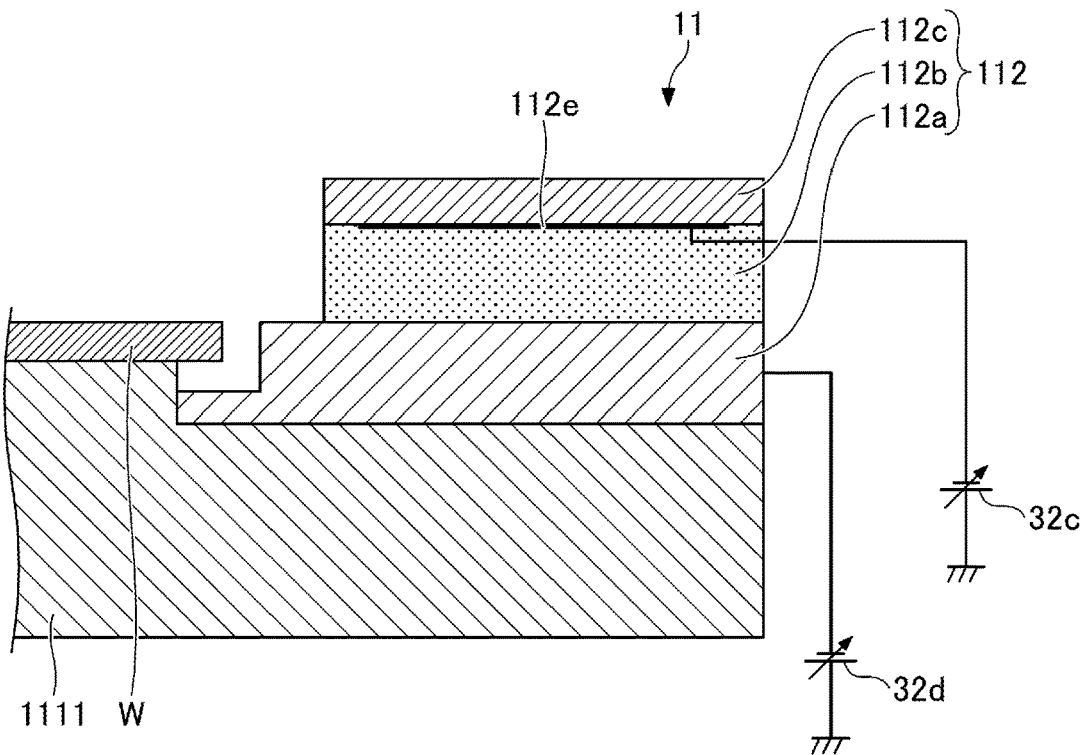
FIG. 11 is a cross sectional view illustrating an example of the substrate support in the plasma processing apparatus according to a fourth embodiment.

FIG. 11 is a cross sectional view illustrating an example of the substrate support 11 in the plasma processing apparatus 1 according to a fourth embodiment. In the ring assembly 112 according to the fourth embodiment, an electrode layer 112e is formed on a surface of the second ring 112b. In the ring assembly 112 according to the fourth embodiment, the electrode layer 112e is an example of the potential generator. In addition, the third DC generator 32c applies a DC signal to the electrode layer 112e. The electrode layer 112e is a metallic film formed on an upper surface of the second ring 112b. By forming a capacitor between the electrode 112d and the third ring 112c, a potential is generated in the third ring 112c. Thus, the third DC generator 32c controls the potential of the third ring 112c to control the state of the equipotential lines, thereby controlling the angle of incidence (tilting) of the Ar ions at the outer periphery of the substrate W.

Figure 12:
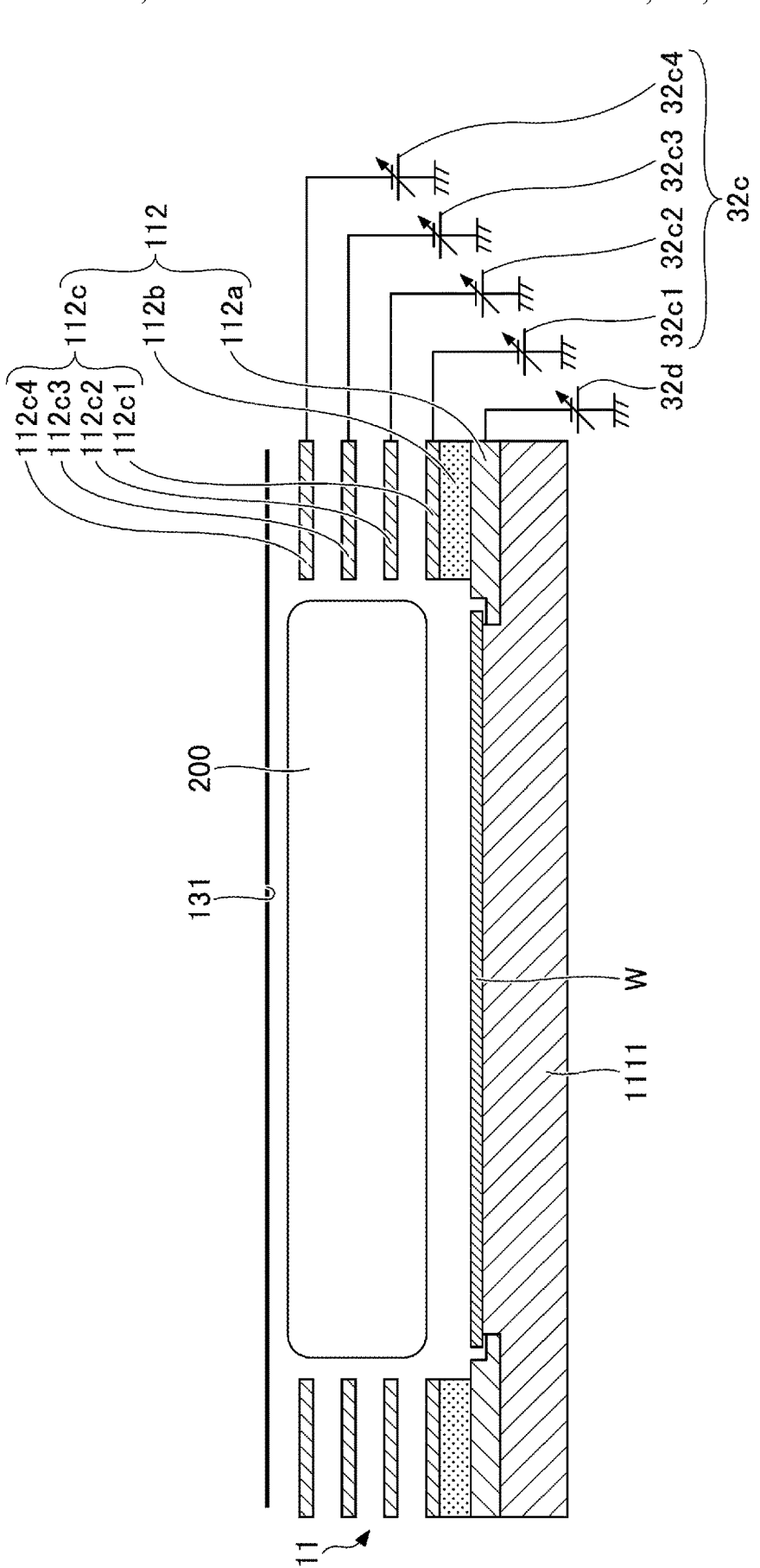
FIG. 12 is a cross sectional view illustrating an example of the substrate support in the plasma processing apparatus according to a fifth embodiment.

FIG. 12 is a cross sectional view illustrating an example of the substrate support 11 in the plasma processing apparatus 1 according to a fifth embodiment. In the ring assembly 112 according to the fifth embodiment, a plurality of third ring 112c is provided along the height direction. In the example illustrated in FIG. 12, the third ring 112c is provided in four stages including third rings 112c1 through 112c4, respectively. In the ring assembly 112 according to the fifth embodiment, the third rings 112c1 through 112c4 are an example of the potential generator.

Further, the third DC generator 32c includes third DC generators 112c1 through 112c4 capable of individually applying DC signals to the third rings 32c1 through 32c4, respectively. The number of third DC generators 112c1 through 112c4 may be reduced, by connecting the plurality of third rings 32c1 through 32c4 via a voltage divider.

The plasma 200 is generated between a lower surface 131 of the shower head 13 and the substrate W. In addition, by forming the sheath around the third rings 112c1 through 112c4, the plasma 200 is confined in a circumferential direction. As a result, a density of the plasma 200 increases, and an etching rate can be improved.

Moreover, as the density of the plasma 200 increases, an impedance of a path from the first ring 112a to the upper electrode (shower head 13) increases. Hence, a utilization efficiency of the RF signal contributing to the plasma 200 increases. As a result, the density of the plasma 200 increases, and the etching rate can be improved.

Further, the shape of the plasma 200 can be controlled by the voltage applied to the third rings 112c1 through 112c4.

Figure 13:
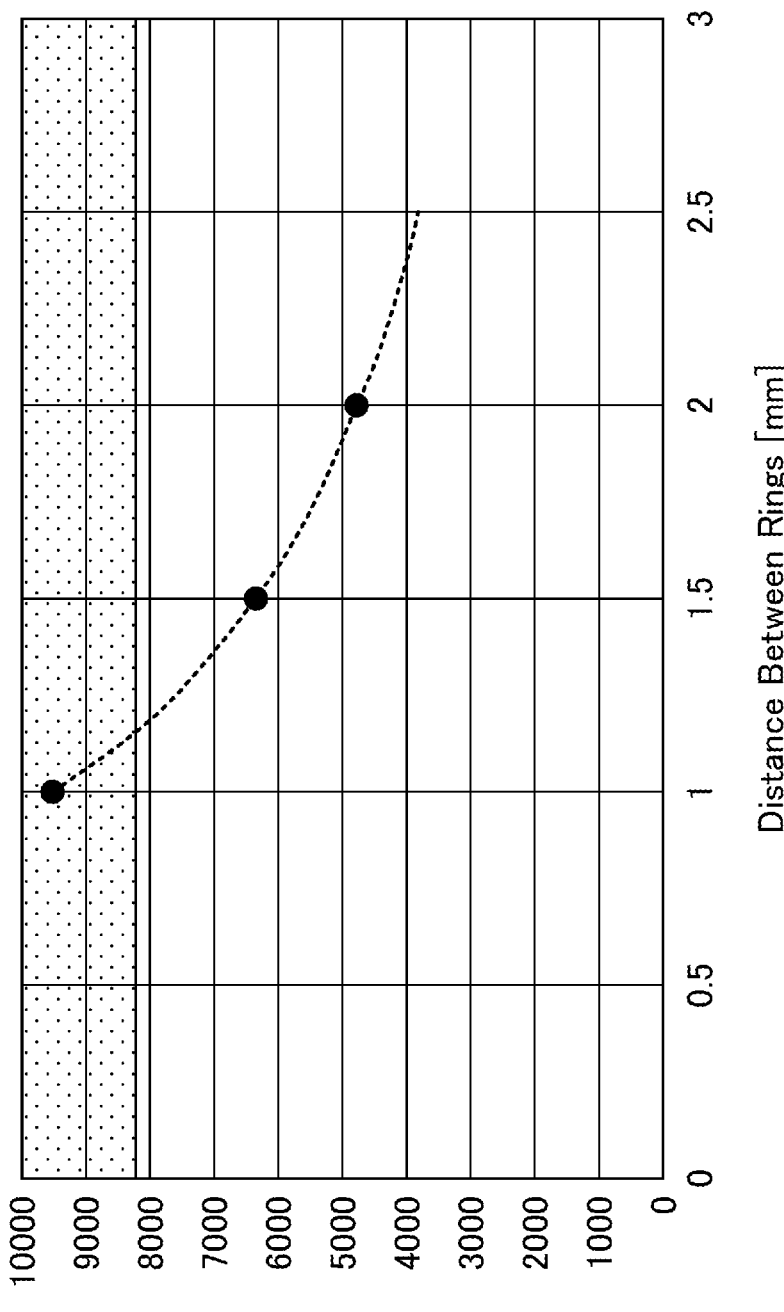
FIG. 13 is an example of a graph illustrating a relationship between a height position of a third ring and discharge.

Next, a height position of the third ring 112c in the ring assembly 112 according to the first embodiment illustrated in FIG. 2 will further be described, with reference to FIG. 13. FIG. 13 is an example of a graph illustrating a relationship between the height position of the third ring 112c and the discharge. In FIG. 13, the abscissa represents a distance between rings, that is, the distance [mm] from the upper surface of the first ring 112a to the lower surface of the third ring 112c. In FIG. 13, the ordinate represents a value [V/mm] obtained by dividing a potential difference between rings, that is, the potential difference [V] between the first ring 112a and the third ring 112c, by the distance between rings. In the graph of FIG. 13, a region where the discharge occurs is indicated in halftone.

As illustrated in FIG. 13, by setting the distance from the upper surface of the first ring 112a to the lower surface of the third ring 112c to 1.25 mm or greater, it is possible to prevent the discharge between the first ring 112a and the third ring 112c. Hence, by setting a distance D (refer to FIG. 2) from the upper surface of the substrate W to the lower surface of the third ring 112c to 1.25 mm or greater, it is possible to prevent the discharge between the substrate W and the third ring 112c.

In addition, when the height positions of the second ring 112b and the third ring 112c become high, the reaction byproduct adheres to a stepped portion between the first ring 112a, and each of the second ring 112b and the third ring 112c. Moreover, the adhered reaction byproduct may fall off and scatter on the substrate W as particles. For this reason, by setting the distance from the upper surface of the first ring 112a to the lower surface of the third ring 112c to 2.00 mm or less, it is possible to reduce adhesion of the reaction byproduct onto the stepped portion, and reduce scattering of the falling reaction byproduct onto the substrate W.

Although the embodiments or the like of the plasma processing system are described above, the present disclosure is not limited to the embodiments or the like described above, and various modifications and improvements may be made within the scope of the subject matter of the present disclosure.

According to one aspect of the present disclosure, it is possible to provide a substrate processing apparatus capable of reducing a variation in an incident angle of ions at an outer periphery of a substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus comprising:
a plasma processing chamber configured to accommodate a substrate;
a ring assembly provided around the substrate inside the plasma processing chamber, and including
a first ring formed of a conductive material and having an annular shape, disposed to surround the substrate,
a second ring formed of a dielectric and having an annular shape, disposed on the first ring,
a third ring formed of a conductive material and having an annular shape, disposed on the second ring, and
an element, distinct from the third ring, formed of a conductive material, and configured to receive an application of a potential, wherein the element is disposed inside or disposed on the second ring without making contact with the first ring, and a lower surface of the element is disposed at a position higher than an upper surface of the substrate; and
a power supply configured to supply a direct current signal or a radio frequency signal to the element.

2. The substrate processing apparatus as claimed in claim 1, wherein a distance between the upper surface of the substrate and the lower surface of the element is 1.25 mm or greater.

3. The substrate processing apparatus as claimed in claim 1, wherein the ring assembly further includes:
an electrode embedded in the second ring and forming the element.

4. The substrate processing apparatus as claimed in claim 1, wherein the ring assembly further includes:
an electrode layer formed on the second ring and forming the element.

5. The substrate processing apparatus as claimed in claim 3, wherein an inside diameter of the second ring is larger than an inside diameter of the first ring.

6. The substrate processing apparatus as claimed in claim 3, wherein an inside diameter of the third ring is larger than an inside diameter of the first ring.

7. The substrate processing apparatus as claimed in claim 3, wherein an inside diameter of the third ring is equal to an inside diameter of the second ring.

8. The substrate processing apparatus as claimed in claim 1, wherein the element is an electrode arranged inside or arranged on the second ring.

9. The substrate processing apparatus as claimed in claim 1, wherein a distance from an upper surface of the first ring to a lower surface of the third ring is 1.25 mm or greater and 2.00 mm or less.

10. A substrate processing apparatus comprising:

a plasma processing chamber configured to accommodate a substrate;

a ring assembly provided around the substrate, and including:

a dielectric, an element formed of a conductive material, disposed on the dielectric, and configured to receive an application of a potential, wherein a lower surface of the element is disposed at a position higher than an upper surface of the substrate, a first ring formed of a conductive material and having an annular shape, disposed to surround the substrate, a second ring formed of the dielectric and having an annular shape, disposed on the first ring, and a plurality of third rings formed of a conductive material and having an annular shape, disposed on the second ring, the plurality of third rings forming the element; and a power supply configured to supply a direct current signal or a radio frequency signal to the element.

11. A substrate processing apparatus comprising:

a plasma processing chamber configured to accommodate a substrate;

a ring assembly provided around the substrate inside the plasma processing chamber, and including a first ring formed of a conductive material and having an annular shape, disposed to surround the substrate, a second ring formed of a dielectric and having an annular shape, disposed on the first ring, a third ring formed of a conductive material and having an annular shape, disposed on the second ring, and an element formed of a conductive material and configured to directly receive an application of a potential, wherein the element is disposed inside or disposed on the second ring without making contact with the first ring, and a lower surface of the element is disposed at a position higher than an upper surface of the substrate; and a power supply configured to supply a direct current signal or a radio frequency signal to the element as the potential.

\* \* \* \* \*